US006454852B2

(12) United States Patent
Dietze et al.

(10) Patent No.: US 6,454,852 B2
(45) Date of Patent: Sep. 24, 2002

(54) HIGH EFFICIENCY SILICON WAFER OPTIMIZED FOR ADVANCED SEMICONDUCTOR DEVICES

(75) Inventors: Gerald R. Dietze; Sean G. Hanna, both of Portland, OR (US); Zbigniew J. Radzimski, Brush Prairie, WA (US)

(73) Assignee: SEH America, Inc., Vancouver, WA (US)

( * ) Notice: Subject to any disclaimer, the term of this patent is extended or adjusted under 35 U.S.C. 154(b) by 0 days.

(21) Appl. No.: 09/759,030

(22) Filed: Jan. 11, 2001

Related U.S. Application Data

(63) Continuation-in-part of application No. 09/567,659, filed on May 9, 2000, which is a continuation-in-part of application No. 09/353,196, filed on Jul. 14, 1999, now abandoned, and a continuation-in-part of application No. 09/353,197, filed on Jul. 14, 1999.

(51) Int. Cl.$^7$ ............................................. C30B 15/20
(52) U.S. Cl. ........................ 117/29; 117/208; 117/217; 117/218
(58) Field of Search ............................ 117/13, 29, 208, 117/217, 218

(56) References Cited

U.S. PATENT DOCUMENTS

| | | | |
|---|---|---|---|
| 2,842,467 A | 7/1958 | Landauer et al. | |
| 4,330,359 A | 5/1982 | Schlichta | |
| 4,468,260 A | 8/1984 | Hiramoto | |

(List continued on next page.)

FOREIGN PATENT DOCUMENTS

| | | | |
|---|---|---|---|
| DE | 10 47 390 B | 12/1958 | |
| EP | 0 319 031 A2 | 6/1989 | |
| EP | 0 462 741 A2 | 12/1991 | |
| GB | 2 198 966 A | 6/1988 | |
| JP | 62-275087 A | 11/1987 | |
| JP | 04091427 A | 3/1992 | |
| WO | WO 86/02919 A1 | 11/1984 | |
| WO | WO 99/57344 A1 | 11/1999 | |

OTHER PUBLICATIONS

*ASM–Advanced Semiconductor Materials*, Operation and Maintenance, Reactor Section, Nov. 1995, pp. 7–1.
*Webster's New Collegiate Dictionary*, 1975, G. & C. Merriam Co., p. 887.
CZ Silicon Crystal Grown in Transverse Magnetic Fields, K. Hoshi et al., Extended Abstracts, vol. 80–1, 1980, pp. 811–813.
Controlling the Oxygen Concentration of Silicon Crystals by Magnetically Induced Melt Rotation, E. M. Hull, IBM Technical Disclosure Bulletin, vol. 23, No. 7A, Dec. 1980.
Semiconductor Silicon Crystal Technology, F. Shimura, Academic Press, Inc., San Diego, CA, 1988, pp. 178–181.

*Primary Examiner*—Felisa Hiteshew
(74) *Attorney, Agent, or Firm*—Alston & Bird LLP

(57) ABSTRACT

A low-cost method of manufacturing a silicon wafer is provided. The method comprises providing a crucible for melting silicon; adding silicon to the crucible; melting the silicon to form a melt; applying an electrical potential across the crucible; pulling a silicon crystal from the melt according to the Czochralski technique at a pulling rate of greater than 1.1 mm/min; and forming a silicon wafer from the silicon crystal. The method may also include adding a nitrogen-containing dopant to the crucible. Furthermore, the method may include etching the wafer first in an alkaline etching solution, and then in an acidic etching solution. The method may also include simultaneously depositing an epitaxial first film on the frontside of the wafer and a second film on the backside of the wafer, wherein the second film traps impurities on the backside of the wafer so the impurities do not contaminate the frontside of the wafer while the epitaxial first film is being grown.

33 Claims, 5 Drawing Sheets

U.S. PATENT DOCUMENTS

| | | |
|---|---|---|
| 4,533,820 A | 8/1985 | Shimizu |
| 4,540,876 A | 9/1985 | McGinty |
| 4,548,670 A | 10/1985 | Pinkhasov |
| 4,821,674 A | 4/1989 | deBoer et al. |
| 5,002,630 A | 3/1991 | Kermani et al. |
| 5,044,943 A | 9/1991 | Bowman et al. |
| 5,108,792 A | 4/1992 | Anderson et al. |
| 5,156,820 A | 10/1992 | Wong et al. |
| 5,223,081 A | 6/1993 | Doan |
| 5,224,503 A | 7/1993 | Thompson et al. |
| 5,248,378 A | 9/1993 | Oda et al. |
| 5,357,898 A | 10/1994 | Kurosawa et al. |
| 5,421,893 A | 6/1995 | Perlov |
| 5,474,020 A | 12/1995 | Bell et al. |
| 5,489,341 A | 2/1996 | Bergman et al. |
| 5,493,987 A | 2/1996 | McDiarmid et al. |
| 5,500,081 A | 3/1996 | Bergman |
| 5,584,310 A | 12/1996 | Bergman et al. |
| 5,723,337 A | 3/1998 | Muller et al. |
| 5,762,751 A | 6/1998 | Bleck et al. |
| 5,779,791 A | 7/1998 | Korb et al. |
| 5,803,977 A | 9/1998 | Tepman et al. |
| 5,846,073 A | 12/1998 | Weaver |
| 5,863,843 A | 1/1999 | Green et al. |
| 5,882,398 A | 3/1999 | Sonokawa et al. |
| 5,895,596 A | 4/1999 | Stoddard et al. |
| 5,899,731 A | 5/1999 | Kai et al. |
| 5,904,478 A | 5/1999 | Weaver et al. |
| 5,908,292 A | 6/1999 | Smith et al. |
| 5,911,826 A | 6/1999 | Hiraishi et al. |
| 5,911,889 A | 6/1999 | Fabry et al. |
| 5,935,320 A | 8/1999 | Graef et al. |
| 5,951,775 A | 9/1999 | Tepman |
| 5,954,873 A | 9/1999 | Hourai et al. |
| 5,964,953 A | 10/1999 | Mettifogo |
| 5,972,116 A | 10/1999 | Takagi |
| 5,976,983 A | 11/1999 | Miyazaki et al. |
| 6,053,982 A | 4/2000 | Halpin et al. |
| 6,059,875 A | 5/2000 | Kirkland et al. |
| 6,077,343 A | 6/2000 | Iida et al. |
| 6,086,680 A | 7/2000 | Foster et al. |
| 6,228,165 B1 | 5/2001 | Baba et al. |

# HIGH EFFICIENCY SILICON WAFER OPTIMIZED FOR ADVANCED SEMICONDUCTOR DEVICES

CROSS-REFERENCE TO RELATED APPLICATIONS

This application is a continuation-in-part of application Ser. No. 09/567,659, filed May 9, 2000, which is a continuation-in-part of application Ser. No. 09/353,196, filed Jul. 14, 1999, now abandoned and application Ser. No. 09/353,197, filed Jul. 14, 1999, the disclosures of which are incorporated by reference herein.

TECHNICAL FIELD

The present invention relates to a method of manufacturing a semiconductor wafer, and more particularly to a low-cost method of manufacturing a high-quality silicon wafer.

BACKGROUND

Many processing steps are required to produce a silicon wafer from raw electrical-grade silicon. Ordinarily, a wafer manufacturing process includes processes for at least (1) forming a silicon single crystal from the raw silicon, (2) cutting a wafers from the crystal, (3) lapping and grinding the wafer, (4) etching the wafer to remove damage from the wafer surfaces, and (5) polishing and cleaning the wafer.

Each of these processes generally comprises numerous discrete steps. For example, the silicon crystal formation process requires first melting raw silicon in a crucible under an inert atmosphere, then pulling the crystal from the melt, and then shaping the crystal. Each of these individual steps may be quite slow, and can contribute significantly to the overall expense of manufacturing a wafer. For example, melting the silicon involves the relatively time-consuming steps of pumping down the pulling chamber and heating the crucible.

The crystal formation process contributes to the overall costs of manufacturing wafers in other ways as well. For example, the crucible from which the crystal is pulled is degraded by exposure to the silicon melt, and is typically rendered unsuitable for use after the pulling of only one or two crystals. Thus, the crucibles must be changed regularly. Changing the crucibles requires exposing the inside of the pulling system to the external atmosphere while the crucible is being changed, thus possibly necessitating later time-consuming outgassing and purging steps.

Other stages contribute to the cost of the wafer manufacturing process in a number of different ways. For example, the edge-shaping process may comprise several individual edge-grinding steps, depending upon the profile given to the edge. A beveling process may comprise three separate grinding steps: one for beveling each corner of the edge, and one for smoothing the remaining central portion of the edge. The greater the number of individual grinding steps needed, the greater the cost of the overall manufacturing process. As another example, a typical $HF/HNO_3$ wafer etching process poses costs in the form of high-purity reagents and fluorine and nitrate waste disposal.

The above-described steps are used in essentially every silicon wafer manufacturing process. Sometimes, however, a wafer is desired that has enhanced physical properties relative to ordinary wafers. In these situations, the wafer must undergo additional processing steps that further increase manufacturing costs. For example, the wafer may undergo a thermal cycling process to form intrinsic gettering sites. During the crystal pulling process, oxygen from the walls of the quartz or fused silica crucible dissolves into the silicon melt as the crucible wall degrades. This oxygen, via the thermal cycling process, can be intentionally precipitated from the bulk silicon in regions away from device regions of the wafer to create gettering sites within the wafer bulk. Generally, the thermal cycling process is a three-step process. First, a high-temperature step is used to remove oxygen from the surface regions of the wafer, where it can harm circuit performance. Next, a lower temperature step is used to nucleate the oxygen precipitates. Finally, another high-temperature step is used to increase the size of the precipitates to create lattice strain.

The wafer may also be subjected to additional processes to create extrinsic gettering sites on the wafer backside. The creation of extrinsic gettering sites generally involves the creation of damage or stress in the backside of the wafer, which causes defects that can trap mobile impurities to form in the silicon lattice. Commonly used processes for damaging the wafer backside include sandblasting, grooving and abrading the wafer backside. The use of these extrinsic gettering techniques is not particularly desirable, as they may cause the contamination of the wafer. Another extrinsic gettering technique involves depositing a film of polycrystalline silicon on the back of the wafer via LPCVD. The grain boundaries and lattice defects in the polycrystalline silicon film act as gettering sites. Though this technique poses less of a danger of contamination, it requires the addition of an additional LPCVD step to the wafer manufacturing process, further increasing the cost of the overall process.

As another example of a process that increase the cost of wafers, some circuit fabrication processes may require wafers with precisely engineered electrical properties. In these instances, a precisely doped epitaxial film may be grown on the frontside of the wafer to give the wafer, commonly known as an epitaxial wafer, the desired electrical properties. The epitaxial deposition process consists of several individual steps. First, the backside of the wafer is usually sealed with an $SiO_2$ film to prevent any wafer dopants or impurities on the wafer backside from contaminating the growing epitaxial film. The $SiO_2$ film is typically deposited via an LPCVD process that includes pumpdown, heating, deposition and cooling steps. Next, the wafer is placed in an epitaxial deposition chamber for the epitaxial deposition process. This process also has pumpdown, heating, deposition and cooling steps. Thus, the deposition of the epitaxial layer requires two entire deposition cycles: one for the backseal process and one for the epitaxial deposition. These cycles each add additional time and expense to the wafer manufacturing process, and may make the resulting wafer prohibitively expensive for potential users. Finally, sometimes the oxide film must be removed from the wafer backside before the wafers can be used for circuit fabrication. The film is usually removed with an HF stripping process, adding even more costs to the manufacturing process.

The cost of the wafer manufacturing process increases with each additional step used. Because high-quality wafers require more manufacturing steps than ordinary wafers, they may be too expensive for use in some applications where they may otherwise be desirable. Thus, there remains a need for a lower-cost method of manufacturing a high quality wafer, and in particular an epitaxial wafer.

SUMMARY OF THE INVENTION

One aspect of the present invention provides a method of manufacturing a silicon wafer. The method comprises providing a crucible for melting silicon; adding silicon to the crucible; melting the silicon to form a melt; applying an electrical potential across the crucible; pulling a silicon crystal from the melt according to the Czochralski technique at a pulling rate of greater than 1.1 mm/min; and forming a silicon wafer from the silicon crystal. The method may also include simultaneously depositing an epitaxial first film on the frontside of the wafer and a second film on the backside of the wafer, wherein the second film traps impurities on the backside of the wafer so the impurities do not contaminate the frontside of the wafer while the epitaxial first film is being grown. Furthermore, the method may also include adding a nitrogen-containing dopant to the crucible.

Another aspect of the present invention provides a method of manufacturing a silicon wafer. The method comprises forming a silicon crystal; forming a silicon wafer from the silicon crystal, the wafer having a frontside, a backside and an edge; rounding the edge of the wafer; etching the wafer in an alkaline etching solution; immersing the wafer in an acidic etching solution after etching the wafer in the alkaline etching solution; and simultaneously depositing an epitaxial first film on the frontside of the wafer and a second film on the backside of the wafer, wherein the second film traps impurities on the backside of the wafer so the impurities do not contaminate the frontside of the wafer. The method may also include adding a nitrogencontaining dopant to the crucible.

DETAILED DESCRIPTION OF THE PREFERRED EMBODIMENTS

Figure 1:
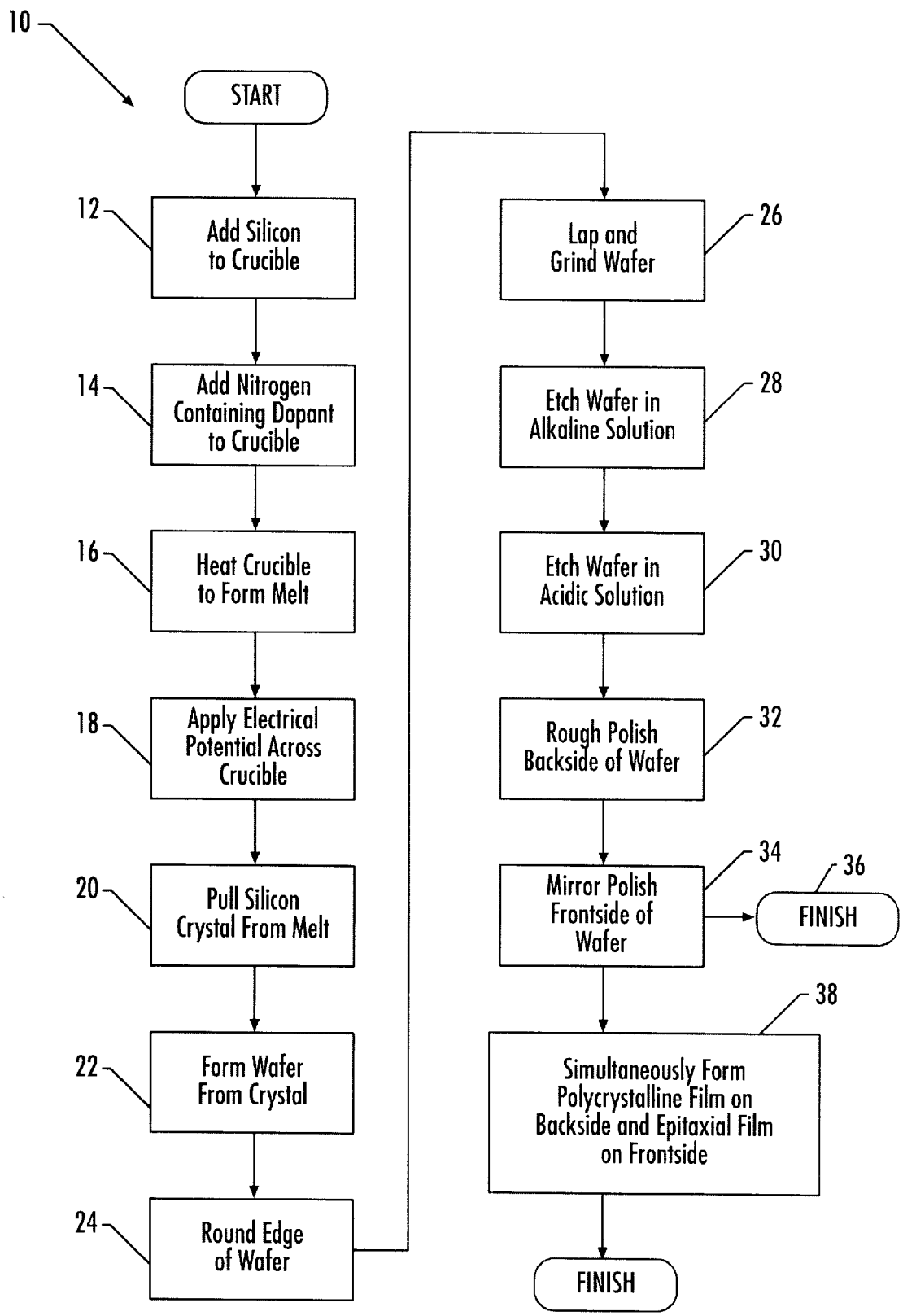
FIG. 1 is a flow diagram showing a method of manufacturing a silicon wafer according to an embodiment of the present invention.

The present invention provides a low-cost method of manufacturing a semiconductor wafer of high quality. The method is particularly suited for manufacturing a silicon wafer, but may be used to manufacture any desired semiconductor wafer. One embodiment of the invention is shown generally at 10 in FIG. 1 as a method of manufacturing an epitaxial silicon wafer. Method 10 includes forming a charge, or melt, from which a silicon crystal may be pulled by adding silicon to a crucible at 12, adding a nitrogen containing dopant, such as silicon nitride, at 14, and heating the crucible at 16 to form the melt. During the formation of the melt, or after the melt has been formed, an electrical potential is applied across the crucible at 18 between the inner surface of the crucible and the outer surface of the crucible. Next, a silicon crystal is pulled from the melt at 20 according to the Czochralski technique. The electrical potential is maintained across the crucible for at least part of the duration of the crystal pulling process. A wafer is then formed from the crystal at 22, and the edge of the wafer is shaped, and preferably rounded, at 24. After the edge has been shaped, the wafer is lapped and ground at 26. Next, damage caused by the lapping and grinding steps is removed from the wafer at 28 by an alkaline etching process. The alkaline etch at 28 is followed first by an acid etch at 30, and then a series of polishing steps, in which the wafer backside is optionally rough polished at 32 and the frontside is mirror polished at 34. If the wafer is not to be an epitaxial wafer, then it may be used for circuit fabrications after the polishing processes, as indicated at 36. If, however, the wafer is to be an epitaxial wafer, then it undergoes a final process at 38 of simultaneously depositing a polycrystalline film on the wafer backside and an epitaxial film on the wafer frontside.

The steps of adding a nitrogen-containing dopant at 14, applying an electrical potential across the crucible at 18 while pulling the crystal, rounding the edge of the wafer at 24, etching the wafer in an alkaline solution at 30 and simultaneously depositing the epitaxial frontside film and the polycrystalline backside film combine to produce a high-quality wafer at a lower cost than known processes. A wafer made in accordance with the present invention has enhanced gettering properties, high mechanical strength, high purity and a low concentration of surface defects relative to known wafers made at a comparable cost.

The doping of the crystal with a nitrogen-containing dopant improves the gettering properties and mechanical strength of the wafer. It also lowers the concentration of surface defects in wafers formed from the process, yet is less expensive than techniques used to improve these properties in the past. Regarding gettering, the addition of nitrogen the nitrogen helps to form intrinsic gettering sites during the crystal growing process without having to perform additional thermal cycling. The nitrogen atoms cause oxygen precipitates to nucleate in the growing crystal, and the residual heat in the crystal and surrounding environment causes the precipitates to grow. The growing precipitates create lattice strain, which, in turn, causes gettering defects to form. The size of the precipitates can be regulated by controlling the pull rate of the crystal. Thus, because no additional thermal cycling is necessary, the cost of forming intrinsic gettering sites within the wafer is reduced relative to thermal cycling processes.

The nitrogen doping has the added benefit of suppressing the tendency of point defects within the crystal to agglomerate into voids. When these voids are exposed on the surface of a wafer by the SC-1 cleaning technique, they are known as crystal originated particles (COP). By suppressing point defect agglomeration, the nitrogen reduces the size of COP, improving the wafer surface. Nitrogen doping also helps prevent the propagation of other defects in the crystal, thus helping to prevent wafer breakage or warpage in later processing steps and increasing the overall mechanical strength of the crystal.

The adding of silicon to the crucible at 12 may be performed in any suitable manner. Generally, electrical grade polycrystalline silicon is added to a fused silica or quartz crucible in either chunk or granular form. If desired, a dopant may be added to the crucible along with the polycrystalline silicon to form a p or n type crystal. This dopant may be added to the crucible in any desired manner, such as by adding a heavily-doped silicon alloy to the crucible along with the polycrystalline silicon.

Similarly, the adding of a nitrogen-containing dopant to the crucible at 14 may be performed in any desired manner. For example, a nitrogen-containing gas, such as nitrogen gas or nitrous oxide, can be added to the atmosphere within the puller so that nitrogen is dissolved into the melt at the gas-melt interface. Nitrogen can also be added to the melt in solid form. For example, as is known in the art, the inner wall of the crucible can be coated with silicon nitride so that some nitrogen is incorporated into the silicon melt as the walls of the crucible degrade, or silicon nitride-coated wafers may be dissolved into the melt. In the preferred embodiment, silicon nitride is added to the crucible at 14 in powdered form before the crucible is heated to form the melt at 16, as described in U.S. Pat. No. 6,059,875 to Kirkland et al., which is incorporated by reference herein. In this method, granular silicon nitride is added to the crucible before the crucible is heated so that the nitrogen dissolves into the silicon as the silicon is melted. This method minimizes the number of steps necessary to perform the nitrogen doping, and thus lessens the cost of the nitrogen doping process.

While granular silicon nitride is a preferred nitrogen-containing dopant, other suitable granular nitrogen-containing dopants may also be used. Suitable dopants include those that introduce minimal amounts of other contaminants or dopants into the melt besides the desired quantity of nitrogen.

The granular nitrogen-containing dopant may have any desired average particle size. Generally, the rate of dissolution of the nitrogen-containing dopant into the silicon melt is inversely proportional to the average particle size of the dopant; the larger the average particle size, the slower the dissolution into the melt. This is because the surface area of dopant exposed to the silicon melt relative to the overall mass of dopant added to the crucible decreases with increasing particle size. Thus, to decrease the time necessary to dissolve the dopant, it is preferable to use relatively fine-ground powder. An example of a suitable powder is a powder with an average particle size of 3 mm or less.

The nitrogen-containing dopant is generally added in a sufficient quantity to improve the resistance of the wafer to mechanical damage, yet in a low enough quantity not to alter the conductivity of the wafers appreciably. Typically, the nitrogen-containing dopant is added in a quantity sufficient to give wafers formed from the melt a nitrogen concentration of between $1 \times 10^{10}$ and $5 \times 10^{15}$ nitrogen atoms/cm$^3$, and more preferably $6 \times 10^{14}$ nitrogen atoms/cm$^3$. While these ranges are preferred ranges, it is to be understood that the wafers may have concentrations of nitrogen outside of these ranges as well and still be within the scope of the present invention.

The nitrogen-containing dopant may be added to the melt at any desired time before the pulling of the crystal. Generally, enough time should be allowed for the nitrogen-containing dopant to dissolve completely and mix uniformly into the silicon melt before pulling the crystal. In the depicted embodiment, the nitrogen-containing dopant is added to the crucible before the crucible is heated so that the dopant dissolves into the silicon as the silicon melts. However, it is also possible to add the dopant to the crucible either during the melting process, or after the silicon has been completely melted.

The application of an electric potential across the crucible at 18 while pulling the crystal helps to slow the degradation of the crucible by the melt. The degradation caused by prolonged exposure to the melt is at least partially the result of the inner surface of the quartz crucible undergoing phase transformations to other crystalline silicate phases, such as β-cristobalite. These phases may be either more or less resistant to the melt than the surrounding quartz regions of the crucible. This can result in the undercutting of the more resistant regions as the melt erodes away the less resistant regions more rapidly. Such undercutting can cause small particles from the crucible wall to be released into the melt. While the exact process by which applying an electrical potential to a crucible prevents the release of β-cristobalite into the silicon melt is not known in detail, it is believed that the electrical potential causes substantially the entire inner surface of the crucible to undergo the phase transformation to β-cristobalite. This reduces the chance of regions of β-cristobalite present on the inner surface of the crucible from being undercut and released into the melt. Because the crucible is not degraded as quickly as it is in the absence of an electric potential, three or more, and possibly as many as five or more, crystals may be pulled from a single crucible before the crucible must be changed when an electric potential is used. This results in significant increases in productivity and reductions in costs incurred from the changing of crucibles and machine down time.

The application of the electrical potential across the crucible may also have the additional benefit of impeding the incorporation of metallic contaminants in the melt into the crystal. This is because the electric field may cause any metallic impurities dissolved in the melt in ionic form to migrate through the melt to the crucible wall, and thus away from the growing crystal.

Figure 2:
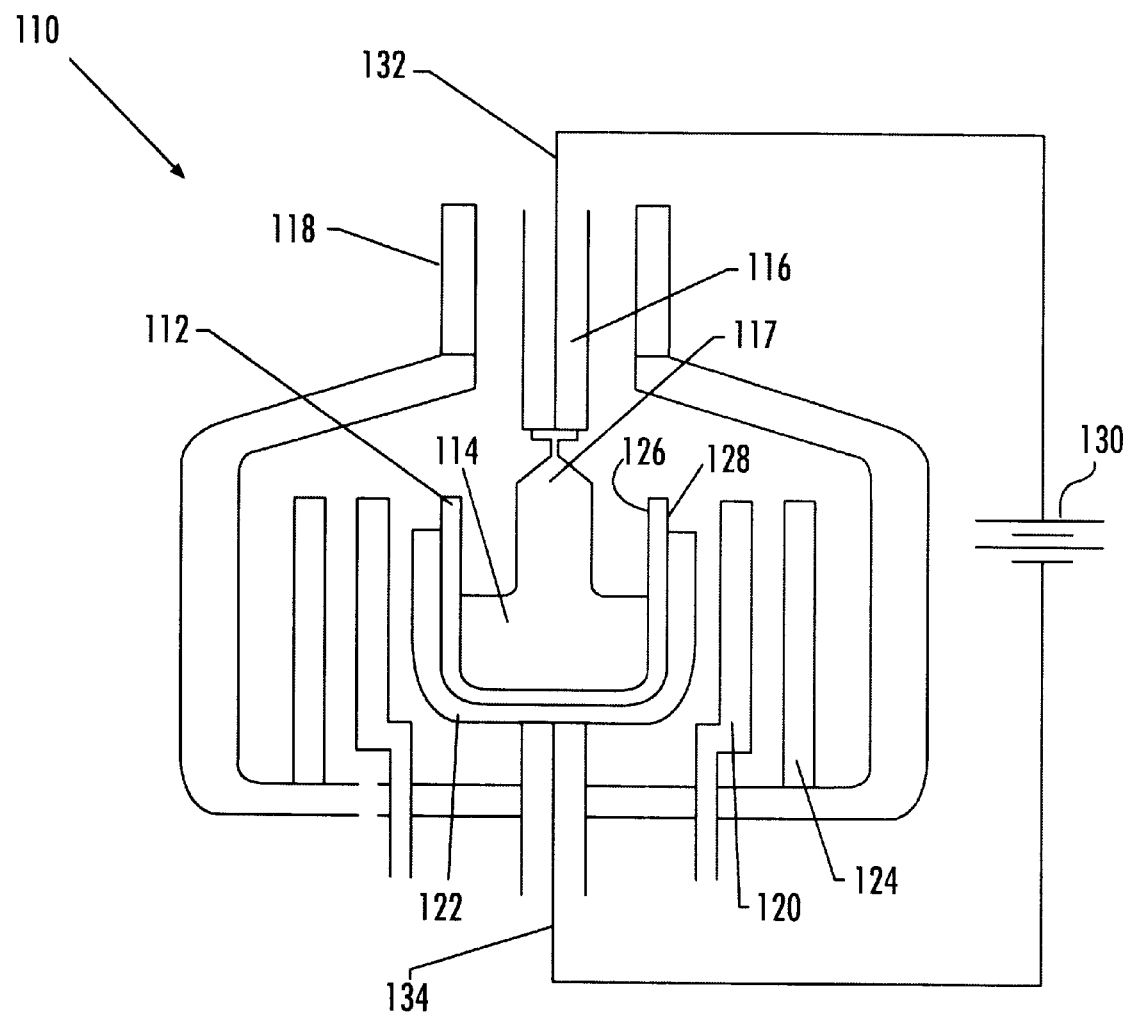
FIG. 2 is a sectional view of a puller suitable for pulling a crystal according to the embodiment of FIG. 1.

Any suitable method of applying an electrical potential across the crucible may be used. One embodiment of a suitable crystal pulling system for applying an electrical potential across the crucible is shown in FIG. 2 at 110. Pulling system 110 is adapted for pulling a crystal via the Czochralski technique, and includes a crucible 112 in which silicon may be melted to form a melt 114. Crucible 112 is typically made of a silicon-based material such as quartz or fused silica. Pulling system 110 also includes a pulling member 116 for pulling a crystal 117 from crucible 112. Pulling member 116 is configured for holding a seed crystal that is dipped into melt 114 to initiate crystal growth, and for pulling crystal 117 from melt 114 as it grows. Pulling member 116 is coupled to various drive mechanisms (not shown) to control the upward and rotational movement of the member while crystal 117 is being pulled. Pulling system 110 also includes an outer wall 118 for isolating the melt from the outside atmosphere, one or more heating elements 120 for heating crucible 112, and a susceptor 122 in contact with crucible 112 for transferring heat to crucible 112. Heating element 120 and susceptor 122 are typically made of a refractory, electrically and thermally conductive material such as graphite. This allows susceptor 122 to support crucible 112 if the crucible softens during heating. A heat-insulating cylinder 124 may surround heating element 120 between outer wall 118 and heating element 120.

Pulling system 110 may be configured to allow an electrical potential to be applied across crucible 112 at 16 in any suitable fashion. In the depicted embodiment, pulling system 110 is configured to allow a first potential relative to ground to be applied to the inner surface 126 of the crucible, and a second potential relative to ground to be applied to the outer crucible surface 128. In the depicted embodiment, the first potential is applied to inner crucible surface 126 by applying the first potential to pulling member 116, and the second potential is applied to outer crucible surface 128 by applying the second potential to susceptor 122. A power supply 130 is connected across the crucible via a first lead 132 attached to pulling member 116 and a second lead 134 attached to susceptor 122. The first potential is transferred through crystal 117 and melt 114 to inner crucible surface 126, while the second potential is transferred through susceptor 122 to outer crucible surface 128.

Any suitable power supply that is capable of providing the desired electrical potential across the crucible may be used. Typically, the electrical potential will have a magnitude in the range of 1–100 V, more typically in the range of 3–24 V, and even more typically in the range of 8–12 V, although values outside of these ranges may also be used. Such voltages will typically result in the flow of a current in the range of from about 0.1 to about 300 mA, and more typically from about 1 to about 200 mA, through the crucible wall, though a current outside these values may also result from the potential applied across the crucible.

The electrical potential may be either constant or oscillating. If a constant potential is applied across the crucible, the more positive terminal of the power supply may be applied either to pulling member 216 or to susceptor 222, although it is typically applied to susceptor 222. In a particularly preferred embodiment of the invention, a 12 V DC potential is applied across the crucible at a current of about 2 to 15 mA. The electrical potential may be applied across the crucible for any portion of the pulling process, or for the entire pulling process.

The speed at which the nitrogen-doped crystal is pulled affects the agglomeration of point defects that forms COP. As a crystal is being pulled, it is subject to temperatures near the melting point of silicon when it is in the hot zone close to the melt. The agglomeration of defects that form COP occurs at these very high temperatures. The further a portion of the crystal is pulled from the crucible, the more quickly it cools. As the crystal cools, the agglomeration of point defects decreases, decreasing the size of COP. Therefore, the agglomeration of point defects that form COP can be decreased by increasing the pulling rate of the crystal to remove the crystal from the hot zone more quickly. Generally, the growth of smaller voids that occurs with a higher pulling speed is accompanied by a higher concentration of voids.

The crystal may be pulled from the melt at 18 at any desired speed. Because smaller COP may be covered with a thinner and less expensive epitaxial layer, it may be desirable to pull the crystal at a relatively fast speed, such as 1.1 mm/min or greater, to form smaller COP. Additionally, it may be desirable to pull the crystal at a higher speed to decrease the initial size of the precipitates, as the initial size of the precipitates may be correlated to the time the wafer spends in the hot zone. A suitable range of faster pulling speeds to achieve these objectives is between 1.1 and 1.3 mm/min, though pulling speeds outside of this range may also be used. Finally, the use of a faster pulling speed increases the rate of crystal production, and thus decreases the cost of the overall manufacturing process.

After the crystal has been pulled at 18, a wafer may be formed from the crystal at 20. Generally, the wafer is cut from the crystal through a process such as sawing, though any other suitable method of forming a wafer may be used.

Once the wafer has been formed from the crystal, the wafer must go through several processing steps before it is ready to be used as a substrate for device fabrication. Generally, the first steps are wafer-shaping steps. In the depicted embodiment, first the edges of the wafer are shaped at 24, and then the wafer is lapped and ground at 26 to reduce the wafer thickness.

The edges can be shaped in any suitable manner. A rounded-edge wafer has superior damage resistance compared to other edge profiles, such as a bevel, as the rounded edge presents no sharp corners that can be easily damaged by wafer processing machinery. Furthermore, the rounded edge can be formed in a single grinding step, whereas the beveled edge, as described above, is formed from three separate grinding steps. Thus, using a rounded edge reduces the cost of edge-shaping process.

Figure 3:
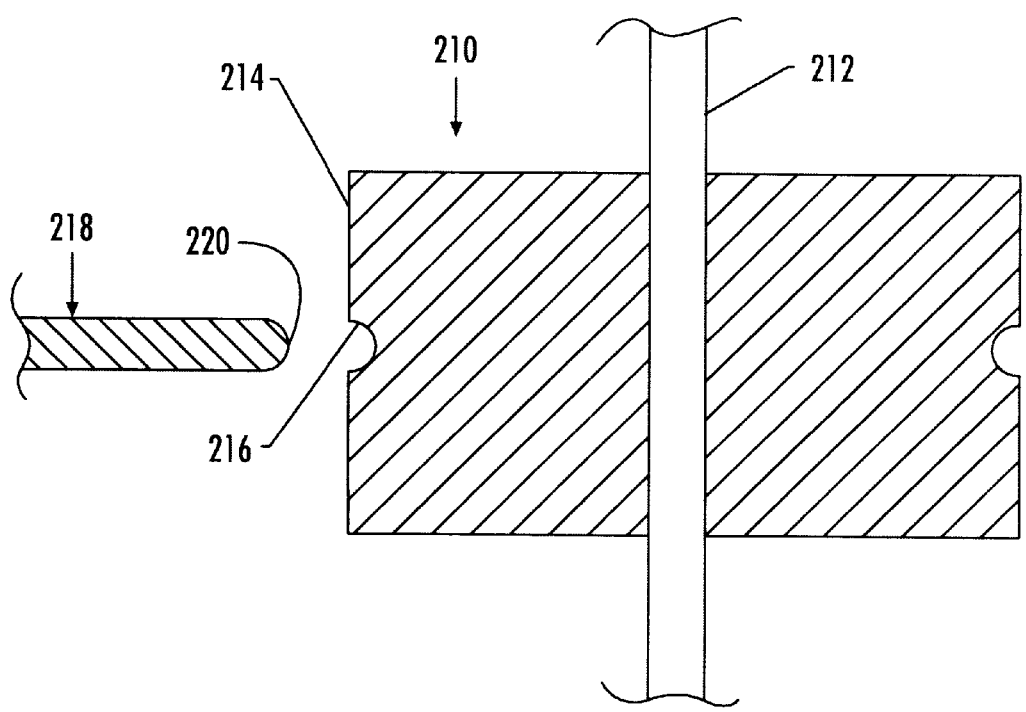
FIG. 3 is a sectional view of a grinding wheel suitable for rounding a wafer edge in accordance with the embodiment of FIG. 1.

In the edge-rounding step, the edge of the wafer is ground with a grinding wheel having a continuously curved, concave grinding surface, as shown generally at 210 in FIG. 3. Grinding wheel 210 includes an axle 212 about which the wheel is spun. Grinding wheel 210 also includes a grinding surface 214 with a continuously curved, concave depression 216. Depression 216 is sized to fit the edge of a wafer, and has the same contour as that which is to be imparted to the wafer edge. FIG. 3 also shows a wafer 218 that has had its edge 220 rounded by grinding wheel 210.

After the wafer edge has been rounded at 24, the wafer is lapped and ground at 26 to reduce the thickness of the wafer, as well as to increase wafer flatness. While the wafer is ground and lapped after the edge is shaped in the depicted embodiment, the wafer may also be ground and lapped before shaping the wafer edge.

The grinding and lapping process leave the wafer surfaces damaged and contaminated. To remove the damaged layer, the wafer is chemically etched. Most known etching processes utilize an acid etching solution consisting of a mixture of nitric, hydrofluoric and acetic acids. The nitric acid oxidizes the silicon, and the hydrofluoric acid then removes the resulting silicon oxide layer.

The acid etching process can add significant expenses to the overall wafer production process. First, the high-purity acids that must be used are often expensive. Second, nitric and hydrofluoric acid wastes pose environmental and health concerns, and can be costly to dispose of.

Instead of utilizing an ordinary acid etch, method 10 first utilizes an alkaline etch at 28, followed by an acid etch at 30. The alkaline etch is used to remove the bulk of the damaged layer of the wafer, and the acid etch is used to smooth the surface after the alkaline etch step. The alkaline etch/acid etch sequence offers several economic advantages over ordinary acid etch processes. First, the bases used to mix the alkaline etching solutions are often less expensive than the acids used in the acid etching process. Second, because the acid etch in the present invention is used only to remove a portion of the damaged material, a greater number of wafers can be acid-etched per quantity of solution than if the acid solution were used for the entire etching step. Finally, the bases used for the alkaline etch are generally easier to dispose of than the acid solutions, as the alkaline solutions have fewer toxic or hazardous components.

Any suitable alkaline etching solution may be used for the alkaline etching step at 28. Suitable solutions include hydroxide solutions. The hydroxide ion etches the silicon surface by first oxidizing the silicon to $SiO_3^{2-}$. After this oxidation, the $SiO_3^{2-}$ dissolves into the solution, and is thus removed from the wafer surface. The chemical equation for the oxidation reaction is as follows:

$$Si(s)+2OH^-(aq)+H_2O \rightarrow SiO_3^{2-}(aq)+2H_2(g) \qquad (1)$$

Preferably, the hydroxide base is a strong hydroxide base, as solutions of strong bases contain more dissociated hydroxide ion than solutions of weak bases of the same concentration. Suitable strong hydroxide bases include sodium hydroxide and potassium hydroxide.

The alkaline etching solution may have any desired concentration, and may be any desired temperature. Typically, the alkaline solution has a concentration of from 40 wt. % to 60 wt. %, and more typically between 40 wt. % and 50 wt. %, though other concentrations may also be used. The temperature of the alkaline solution is generally higher than room temperature to increase the etching rate of the solution. Typical temperatures are between 40 and 90 degrees Celsius, and more typical temperatures are between 70 and 90 degrees Celsius.

Any desired amount of material may be removed from the silicon wafer by each of the alkaline and acid etching steps. Generally, it is preferable to remove more material with the alkaline etch than with the acid etch. First, the alkaline etch gives the wafer a higher degree of flatness than the acid etch. Second, as mentioned above, the costs of reagents and disposal may be lower for the alkaline etch process than the acid etch process. In one embodiment of the invention, the alkaline etching process is used to remove approximately 1–4 microns of silicon from the wafer surface, and then the acid etch is used to remove an additional 25–26 microns. In an alternative embodiment, the alkaline etching process is used to remove approximately 20 microns of material, and then the acid etch is used to remove an additional approximately microns. The term "approximately" is used to indicate that small variations from the given ranges, such as variations of +/−2–3 microns, may be made in the amount of material removed by each of the etching process and still be within the scope of the respective embodiment.

After performing the above etching processes, the surfaces of the wafer are polished. According to the embodiment of FIG. 1, the wafer backside first may be rough polished at 32 if desired, and then the front of the wafer is mirror polished at 34. Generally, all of the polishing steps are performed using chemical-mechanical polishing techniques well known in the art. One example of a suitable polishing step involves applying a slurry of sodium hydroxide and silica particles onto the frontside of the wafer, and then polishing the wafer surface with a polishing pad. Cleaning steps, such as SC-1 and SC-2 cleaning processes, may be used to clean the surfaces of the wafer after polishing.

At this point, the wafers may be ready for use in some device fabrication processes, as indicated at 36. The combination of the nitrogen doping, the application of the electrical potential across the crucible, the fast crystal pulling speed, the single-step edge rounding and the alkaline etching process combine to produce a low cost, mechanically strong wafer with enhanced intrinsic gettering properties compared to a wafer manufactured via conventional techniques, absent a thermal cycling process.

Method 10 also provides for the low-cost manufacture of an epitaxial wafer. As indicated in FIG. 1 at 38, the epitaxial film is deposited along with a backside polycrystalline sealing film in a single process. This method offers several advantages over currently known methods. First, the epitaxial film can be deposited without first having to deposit an oxide backseal film on the wafer backside. Second, there is no need to remove the oxide backseal after growing the epitaxial film. Third, the polycrystalline sealing film has grain boundaries that can serve as extrinsic gettering sites. By depositing both the epitaxial film and the backside sealing/gettering film in a single step without the prior deposition of an oxide backseal, the overall cost of the epitaxial wafer manufacturing process is decreased greatly relative to known processes, in which these depositions are performed in separate steps.

The mirror-polishing process at 34 gives the wafer a highly polished, scratch- and damage-free frontside, suitable for the deposition of the epitaxial film. The rough-polishing process gives the backside of the wafer a somewhat rougher surface than the frontside, which tends to encourage the growth of a polycrystalline film on the surface rather than an epitaxial film.

The simultaneous deposition process may involve several discrete steps. First, the wafer is placed into a deposition chamber, and the chamber is prepared for deposition, e.g. by performing any necessary preliminary steps such as pumping the chamber down. The wafer is supported in the chamber on a special holder, described in more detail below, that allows the frontside and backside of the wafer to be simultaneously exposed to a flow of a reactant gas. After the wafer is positioned on the holder, the wafer is heated so that atoms of the deposited material can migrate across the wafer surface to form the epitaxial film. Finally, after the wafer is heated, reactant gas is flowed simultaneously over the frontside and backside of the wafer, causing the deposition of the epitaxial frontside film and the polycrystalline backside sealing film.

Figure 4:
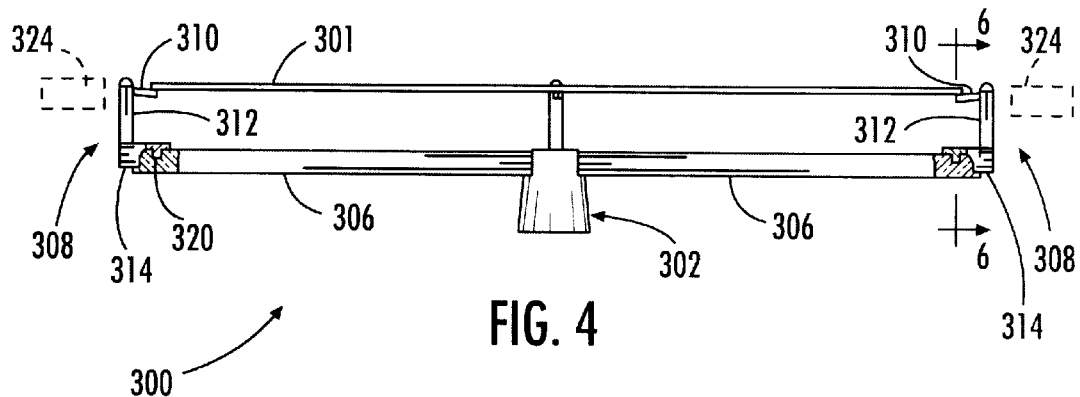
FIG. 4 is a side view of a wafer support for simultaneously depositing an epitaxial film on the wafer frontside and a polycrystalline film on the wafer backside according to the embodiment of FIG. 1.
Figure 5:
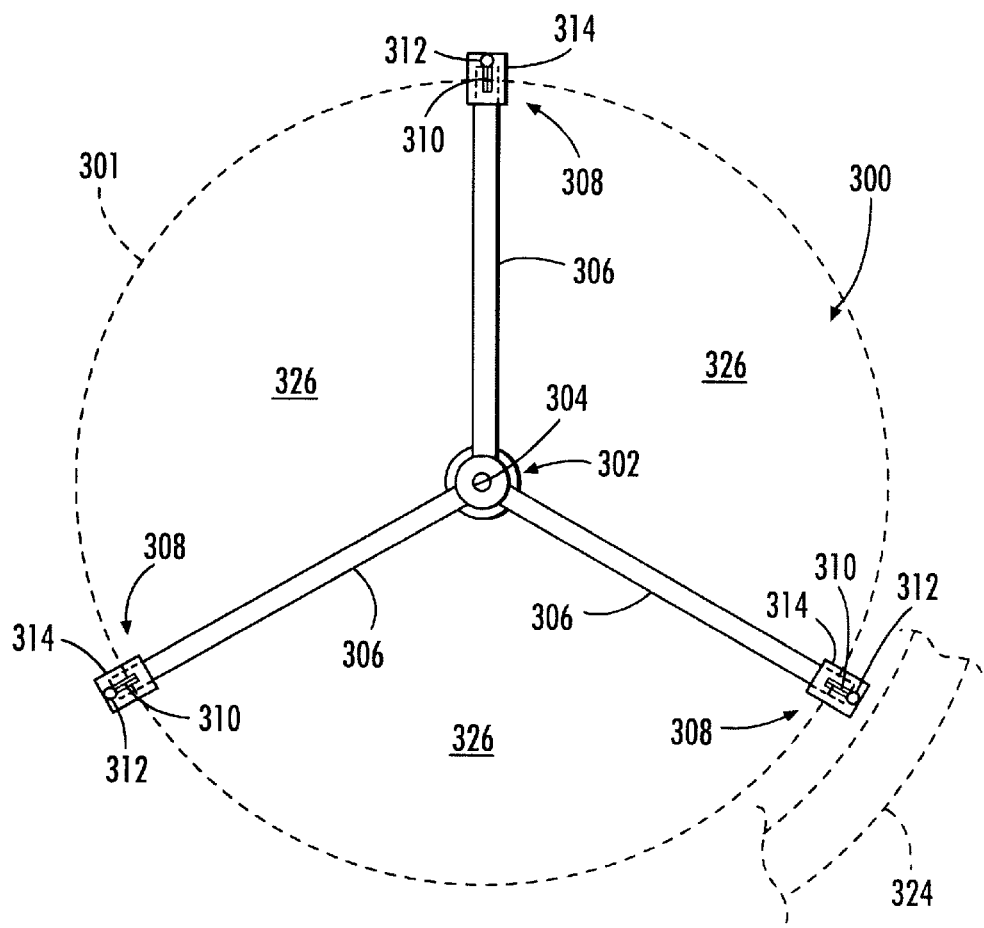
FIG. 5 is a top view of the wafer support of FIG. 4.

The wafer holder that supports the wafer in the deposition chamber allows both the frontside and the backside of the wafer to be exposed simultaneously to reactant gas. One embodiment of a suitable wafer holder is shown in FIG. 4. Wafer support 300 includes a hub 302 that is flared and configured to be mounted to a mounting shaft (not shown) in an epitaxial deposition system. The shaft supports and rotates wafer support 300 within the deposition chamber. A hole 304 is provided in the top of hub 302, through which a thermocouple may be fed.

Figure 6:
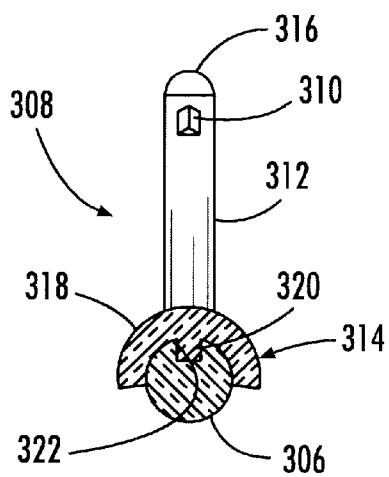
FIG. 6 is a partial cross-sectional view of an arm, coupling member and contact member of the wafer support of FIG. 4.

Wafer support 300 also includes three arms 306 extending radially outward from hub 302. Alternatively, a smaller or greater number of arms may be provided. Arms 306 are typically circular in cross section, as shown in FIG. 6. The top of hub 302 is typically formed horizontally flush with the top of arms 306. Typically, arms 306 extend outward at right angles from hub 302. However, it will be appreciated that arms 306 may extend at another predetermined angle, and/or may curve or spiral outward.

Wafer support 300 includes voids 326 positioned adjacent arms 306. Voids 326 typically extend from backside of wafer 301 to the bottom of the reaction chamber, and are configured to facilitate gas flow to the backside of wafer 301. In addition, voids 326 are configured to allow heat energy to radiate from a lower heat energy source positioned below wafer 301 directly to the backside of wafer 301, without being absorbed by an interfering susceptor or wafer support structure. Typically, wafer support 300 is made of quartz, and is substantially thermally transparent, allowing radiant heat energy to pass directly through its structure.

Wafer support 300 further includes a wafer contact assembly 308 coupled to each arm 306 adjacent a distal end of the arm. Each wafer contact assembly 308 includes a contact member 310 mounted to an upwardly extending support member 312, also referred to as post 312, which is in turn mounted to a respective arm 306 by a coupling member 314.

Figure 9:
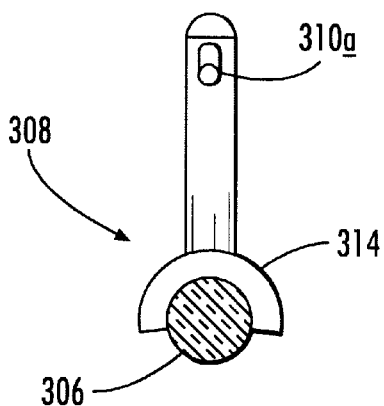
FIG. 9 is a partial cross-sectional view of a second embodiment of a contact member of the wafer support of FIG. 4.

It is desirable to reduce the thermal mass of contact member 310 near wafer 301, in order to reduce thermal interference that may cause abnormalities in the growth of an epitaxial layer on the wafer, such as a heat shadow in the epitaxial layer caused by conductive heat transfer between wafer 301 and contact member 310. Thus, contact member 310 has a shape with minimal surface area near the contact point with wafer 301. Typically, contact member 310 is triangular in shape, as shown in FIG. 6. Alternatively, contact member 310 may be cylindrical in shape, as shown at 310a in FIG. 9, or may be of some other suitable shape. Typically, the contact member is between about 0.02 and 0.20 inches in width, and preferably is about 0.06 inches in width, at its widest point.

Figure 8:
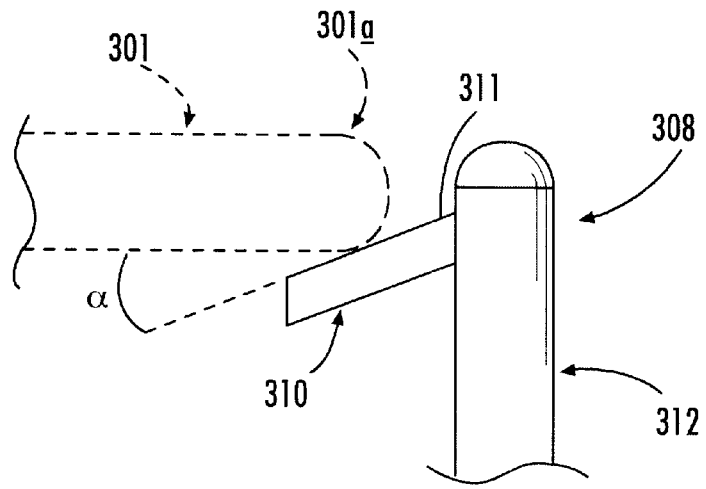
FIG. 8 is a detailed side view of the arm and contact member of the wafer support of FIG. 4.

As shown in FIG. 8, contact member 310 typically extends inwardly and downwardly from post 312. Contact member 310 extends downward from a point above the bottom surface of wafer 301 to a point below the bottom surface. Contact member 310 includes a downwardly sloping top surface portion 311 that is configured to contact an outer edge 301a of wafer 301. The top surface portion 311 of contact member 310 is angled downward at an angle a relative to the horizontal, such that angle a is greater than zero degrees. Thus, contact member 310 contacts the wafer 301 at one point of contact, thereby reducing the thermal interference caused by the wafer support on epitaxial layer growth on the wafer.

Typically, angle α is between about zero and 22 degrees. In one preferred embodiment of the invention, angle α is between zero and 15 degrees. In another preferred embodiment of the invention, angle α is between about zero and 10 degrees, and in a particularly preferred embodiment, angle α is about 4 degrees. It has been found that in these ranges, wafer 301 tends to center itself upon the three contact members when dropped by a paddle or other loading device onto the contact members 310 of wafer support 300. Wafer 301 vibrates slightly as it hits the contact members, and tends towards a centered position because of the inward slope of contact members 310. Thus, successive wafers may be positioned in substantially the same position during the epitaxial growth process, thereby assuring a uniform quality in the epitaxial layers grown on the wafers.

Post 312 typically is mounted to coupling member 314 at a lower end and extends from a point below the bottom surface of wafer 301 to a point above the bottom surface of wafer 301. Post 312 typically includes a rounded top 316, which reduces interference in the gas flow to outer edge 301a of wafer 301. In addition, post 312 is usually circular in cross section. Post 312 is typically positioned outward of the outer edge of the wafer.

Figure 10:
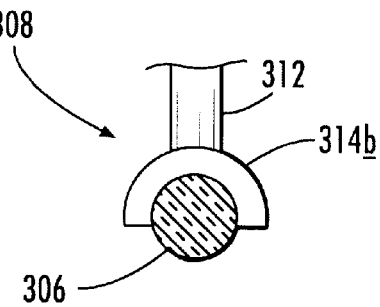
FIG. 10 is a partial cross-sectional view of a third embodiment of the coupling member of the wafer support of FIG. 4.

Coupling member 314 includes a semi-cylindrical member 318 that extends slightly more than 180 degrees around arm 306. The contact assembly is typically quartz. The limited inherent flexibility in this material enables the walls of the semi-cylindrical member 318 to be temporarily bent slightly outward to enable installation of semi-cylindrical member 318 onto arm 306. Alternatively, contact assembly 308 may include a coupling member 314b with a semi-cylindrical member that extends 180 degrees, or less, around arm 306, as shown in FIG. 10.

Figure 7:
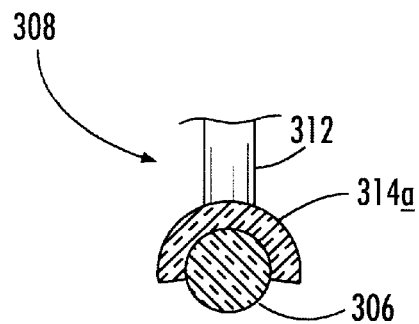
FIG. 7 is a partial cross-sectional view of a second embodiment of the arm and coupling member of the wafer support of FIG. 4.

Coupling member 314 also typically includes a protrusion 320 extending from the semi-cylindrical member 318 into a slot 322 in arm 306. The mating of protrusion 320 and slot 322 serve to secure coupling member 314 on arm 306. Alternatively, the contact assembly may include a coupling member 314a without any protrusion, as shown in FIG. 7. It will be understood that coupling member 314 also may be secured to arm 306 by interference fit, welding or fusing, or other suitable attachment method.

A heat-absorbing ring 324 may also be placed around an outside edge of the wafer 301, adjacent an outer side of each of the wafer contact assemblies 308. Heat-absorbing ring 324 is typically at least as thick as wafer 301. Typically, heat-absorbing ring is made of graphite. Alternatively, another suitable material may be used. Heat-absorbing 324 ring serves to absorb and evenly distribute heat to the edge of wafer 301.

Though the wafer holder depicted in FIGS. 4–10 is a preferred wafer holder, any wafer holder that permits a reactant gas to flow simultaneously over the frontside and the backside of the wafer may also be used to support the wafer in an epitaxial deposition chamber, such as the holders disclosed in the above-referenced U.S. patent application Ser. No. 00/567,659 for a SUSCEPTORLESS SEMICONDUCTOR WAFER SUPPORT AND REACTOR SYSTEM FOR EPITAXIAL LAYER GROWTH, filed May 9, 2000.

After the wafer is placed in the vapor deposition chamber, the wafer is heated to a predetermined deposition temperature. Wafer holder 300 offers an additional advantage of the present method over known deposition methods, as wafer holder 300 allows the frontside and backside of a wafer to be directly heated without having to heat a susceptor. Typically, heat energy is radiated directly to the frontside and backside of the wafer. The radiant energy can pass directly through voids 326 in wafer support 300 to the backside of the wafer. Voids 326 in wafer support 300 enable the heat energy source to heat the wafer without substantial structural interference by a susceptor or the wafer support. In addition, voids 326 decrease the thermal mass of wafer support 300. Therefore, compared to prior reactors with susceptors, the present invention enables the wafer to be heated more directly and quickly, further lowering the overall cost of the wafer manufacturing process.

The wafer is heated until it reaches a predetermined process temperature for the simultaneous growth of the epitaxial silicon film on the wafer frontside and the polycrystalline film on the wafer backside. The process temperature typically is between 900 and 1200 degrees Celsius. A thermocouple may be positioned within hole 304 so that it is proximate the wafer to sense the temperature of the reaction chamber adjacent the wafer. To reduce thermal interference with the wafer, the thermocouple typically does not contact the wafer.

After the wafer is heated, a reactant gas is flowed simultaneously over the frontside and backside of the wafer. The gas flows over the backside of the wafer by flowing through voids 326. The smooth surface of the mirrorpolished wafer frontside allows an epitaxial film to grow on the frontside. However, because the wafer backside is not mirror polished, but rough in comparison to the frontside, a polycrystalline film grows on the backside. The reactant gas may be any gas capable of depositing a high-purity epitaxial film of the desired material onto the frontside of the wafer. Typical gases include silane, silicon tetrachloride and others. Any impurities that are present on the wafer backside are quickly sealed behind the polycrystalline film within the first few moments of deposition, preventing them from contaminating the epitaxial film. It should be noted that a sealing film other than a polycrystalline film, such as an amorphous or single crystal film, may be formed without parting from the scope of the present invention.

Industrial Applicability

The present invention is applicable to the semiconductor processing industry, and more particularly to a method for the low-cost manufacture of high-quality silicon wafers.

It is believed that the disclosure set forth above encompasses multiple distinct inventions with independent utility.

While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. No single feature, function, element or property of the disclosed embodiments is essential to all of the disclosed inventions. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower or equal in scope to the original claims, are also regarded as included within the subject matter of the inventions of the present disclosure.

We claim:

1. A method of manufacturing a silicon wafer, comprising:
    providing a crucible for melting silicon;
    adding silicon to the crucible;
    melting the silicon to form a melt;
    pulling a silicon crystal from the melt according to the Czochralski technique at a pulling rate of greater than 1.1 mm/min;
    forming a silicon wafer from the silicon crystal with the silicon wafer having an edge; and
    rounding the edge of the wafer.

2. The method of claim 1, wherein the pulling rate is 1.1–1.3 mm/min.

3. The method of claim 1, wherein the silicon crystal is a first silicon crystal, further comprising pulling three or more crystals from the melt after pulling the first silicon crystal without changing the crucible.

4. The method of claim 1, wherein rounding the edge of the wafer includes rounding the edge of the wafer with a grinding wheel that has a continuously curved concave grinding surface.

5. The method of claim 1, wherein rounding the edge of the wafer includes rounding the edge of the wafer in a single grinding step.

6. The method of claim 1, the wafer having a frontside and a backside, further comprising simultaneously depositing an epitaxial film on the frontside of the wafer and a sealing film on the backside of the wafer to seal impurities present on the backside of the wafer.

7. The method of claim 6, wherein depositing a sealing film on the backside of the wafer includes depositing a polycrystalline sealing film on the backside of the wafer.

8. The method of claim 6, wherein simultaneously depositing an epitaxial film on the frontside of the wafer and a sealing film on the backside of the wafer includes simultaneously depositing an epitaxial film on the frontside of the wafer and a sealing film on the backside of the wafer by vapor phase deposition.

9. A method of claim 1, further comprising applying an electrical potential across the crucible while pulling at least a portion of the silicon crystal from the melt.

10. The method of claim 9, wherein applying an electric potential across the crucible includes applying an electric potential of 3–24 V across the crucible.

11. The method of claim 9, wherein applying an electric potential across the crucible includes applying an electric potential of 8–12 V across the crucible.

12. The method of claim 9, wherein applying an electric potential across the crucible includes generating the electric potential by passing a current of 0.1–300 mA through the crucible.

13. The method of claim 9, wherein pulling a silicon crystal from the melt includes pulling the silicon crystal from the melt with a pulling member, and wherein applying an electrical potential to the crucible includes applying an electrical potential to the pulling member so that the electrical potential is applied to the crucible through the melt.

14. A method of manufacturing a silicon wafer, comprising:
    providing a crucible for melting silicon;
    adding silicon to the crucible;
    melting the silicon to form a melt;
    adding a nitrogen-containing compound to the crucible such that the melt is a nitrogen-containing melt;
    pulling a silicon crystal from the melt according to the Czochralski technique at a pulling rate of greater than 1.1 mm/min; and
    forming a silicon wafer from the silicon crystal.

15. The method of claim 14, wherein adding a nitrogen-containing dopant to the crucible includes adding a nitrogen-containing dopant to the crucible before heating the silicon to form a melt.

16. The method of claim 15, wherein adding a nitrogen-containing dopant to the crucible before heating the silicon to form a melt includes adding silicon nitride powder to the crucible.

17. The method of claim 16, wherein adding silicon nitride powder to the crucible includes adding silicon nitride powder with an average particle size of less than or equal to 3 millimeters in diameter to the crucible.

18. The method of claim 14, wherein adding a nitrogen-containing dopant to the crucible includes adding the nitrogen-containing dopant to the crucible while heating the silicon to form a melt.

19. The method of claim 14, wherein adding a nitrogen-containing dopant to the crucible includes adding a nitrogen-containing dopant to the crucible in a quantity sufficient to give the nitrogen-doped silicon crystal a nitrogen concentration of between $1 \times 10^{10}$ nitrogen atoms/cm$^3$ and $5 \times 10^{15}$ nitrogen atoms/cm$^3$.

20. The method of claim 14, wherein adding a nitrogen-containing dopant to the crucible includes adding a nitrogen-containing dopant to the crucible in a quantity sufficient to give the nitrogen-doped silicon crystal a nitrogen concentration of between $5 \times 10^{13}$ nitrogen atoms/cm$^3$ and $6 \times 10^{14}$ nitrogen atoms/cm$^3$.

21. A method of claim 14, further comprising applying an electrical potential across the crucible while pulling at least a portion of the silicon crystal from the melt.

22. A method of manufacturing a silicon wafer, comprising:
    providing a crucible for melting silicon;
    adding silicon to the crucible;
    melting the silicon to form a melt;
    pulling a silicon crystal from the melt according to the Czochralski technique at a pulling rate of greater than 1.1 mm/min;

forming a silicon wafer from the silicon crystal; and etching the wafer first in an alkaline etching solution and then in an acid etching solution.

23. The method of claim 22, wherein etching the wafer in an alkaline etching solution includes etching the wafer in an alkaline etching solution to remove 1–20 microns of material from the frontside of the wafer.

24. The method of claim 22, wherein etching the wafer in an alkaline etching solution includes etching the wafer in a hydroxide solution.

25. The method of claim 24, wherein etching the wafer in a hydroxide solution includes etching the wafer in one of a sodium hydroxide and a potassium hydroxide solution.

26. The method of claim 22, wherein etching the wafer in an alkaline etching solution includes immersing the wafer in an alkaline etching solution with a temperature of between 40 and 90 degrees Celsius.

27. The method of claim 22, wherein immersing the wafer in an acidic solution includes etching the wafer in an acid solution such that 10–26 microns of material is removed from the wafer.

28. A method of claim 22, further comprising applying an electrical potential across the crucible while pulling at least a portion of the silicon crystal from the melt.

29. A method of manufacturing a silicon wafer, comprising:

providing a crucible for melting silicon;

adding silicon to the crucible;

melting the silicon to form a melt;

pulling a silicon crystal from the melt;

forming a silicon wafer from the silicon crystal, the wafer having a frontside, a backside and an edge;

mechanically rounding the edge of the wafer by grinding the edge with a grinding wheel having a continuously curved, concave grinding surface; and simultaneously depositing an epitaxial film on the frontside and a gettering film on the backside of the wafer.

30. A method of manufacturing a silicon wafer, comprising:

forming a silicon crystal;

forming a silicon wafer from the silicon crystal, the wafer having a frontside, a backside and an edge;

rounding the edge of the wafer;

etching the wafer in an alkaline etching solution;

immersing the wafer in an acidic etching solution after etching the wafer in the alkaline etching solution; and simultaneously depositing an epitaxial first film on the frontside of the wafer and a second film on the backside of the wafer, wherein the second film traps impurities on the backside of the wafer so the impurities do not contaminate the frontside of the wafer.

31. A method of manufacturing a semiconductor wafer, comprising:

providing a crucible for melting silicon;

adding silicon to the crucible;

melting the silicon to obtain a silicon melt;

pulling a silicon crystal from the silicon melt according to the Czochralski method at a rate of greater than 1.1 mm/min;

forming a silicon wafer from the silicon crystal, the wafer having a frontside and a backside; and simultaneously depositing an epitaxial semiconductor film on the frontside of the wafer and a polycrystalline semiconductor film on the back of the wafer.

32. A method of manufacturing a semiconductor wafer, comprising:

providing a crucible for melting silicon;

adding silicon to the crucible;

adding a nitrogen-containing dopant to the crucible;

melting the silicon to form a nitrogen-doped silicon melt;

applying an electrical potential across the crucible;

pulling a nitrogen-doped silicon crystal from the melt;

forming a wafer from the crystal, the wafer having a frontside, a backside and an edge;

rounding the edge of the wafer;

etching the wafer in an alkaline etching solution;

immersing the wafer in an acidic solution after etching the wafer in the alkaline etching solution;

polishing the wafer; and simultaneously depositing an epitaxial silicon film on the frontside of the wafer and a polycrystalline silicon film on the backside of the wafer.

33. The method of claim 32, wherein the silicon crystal is pulled from the melt at a pulling rate of greater than 1.1 mm/min.

* * * * *